United States Patent

Ochiai et al.

[11] Patent Number: 6,008,581
[45] Date of Patent: Dec. 28, 1999

[54] FRONT PANEL FOR PLASMA DISPLAY

[75] Inventors: Shinsuke Ochiai, Hyogo; Haruyoshi Sannou, Osaka; Satoshi Honda, Ehime, all of Japan

[73] Assignee: Sumitomo Chemical Company, Limited, Osaka, Japan

[21] Appl. No.: 08/999,264

[22] Filed: Dec. 29, 1997

[30] Foreign Application Priority Data

Dec. 26, 1996 [JP] Japan .................................. 8-348934

[51] Int. Cl.$^6$ ...................................... H01J 61/42
[52] U.S. Cl. ...................... 313/582; 313/495; 313/483; 350/321
[58] Field of Search .................... 313/582, 483, 313/495, 583, 584, 585, 586, 504, 506, 503, 486; 350/321, 322

[56] References Cited

U.S. PATENT DOCUMENTS

| | | | |
|---|---|---|---|
| 4,296,215 | 10/1981 | Kamada et al. | 525/2 |
| 4,631,214 | 12/1986 | Hasegawa | 428/68 |
| 4,753,516 | 6/1988 | Doi et al. | 350/321 |
| 5,466,755 | 11/1995 | Sakagami et al. | 525/326.6 |

FOREIGN PATENT DOCUMENTS

| | | |
|---|---|---|
| 0 586 135 | 9/1994 | European Pat. Off. . |
| 6-91340 | 11/1994 | Japan . |
| 7-84123 | 3/1995 | Japan . |

OTHER PUBLICATIONS

Abstract of Japan; Publication No. 08055581; publication date: Feb. 27, 1996.

Abstract of Japan; Publication No. 62051140; publication date: Mar. 3, 1987.

Abstract of Japan; Publication No. 03069349; publication date: Mar. 25, 1991.

Primary Examiner—Vip Patel
Assistant Examiner—Joseph Williams
Attorney, Agent, or Firm—Pillsbury Madison & Sutro LLP

[57] ABSTRACT

The present invention provides a plasma display front panel comprising a laminate of a transparent substrate and a synthetic fiber mesh plated with a metal thereon, and offering an adequate shielding against electromagnetic waves from a plasma display. The invention employs a transparent substrate formed from a resinous composition comprising a copolymer of a monomer having an unsaturated double bond and a phosphorus-containing compound, and a copper-containing compound so as to provide a plasma display front panel featuring an excellent electromagnetic shielding performance and an ability of absorbing near-infrared rays.

14 Claims, 1 Drawing Sheet

FRONT PANEL FOR PLASMA DISPLAY

BACKGROUND OF THE INVENTION

1. Field of the Invention

The present invention relates to a transparent front panel having an excellent electromagnetic shielding performance to be mounted at the front of a plasma display.

2. Description of Related Art

As a front panel for displays, various panels having abrasion-resistance, anti-reflection property or stain-proofing property have been proposed in order to protect the display surface, prevent the unclear images due to reflection of illumination light and a background, and proof the stain on the display surface.

Among various types of displays, plasma displays have attracted a person's attention because of their thinness and large screen size. However, there have been concerns about the effect on the peripheral devices and human health by electromagnetic waves emitted from the screen and its periphery of the plasma displays.

Unfortunately, the known display front panels having abrasion-resistance, anti-reflection property or stain-proofing property cannot adequately shield against the electromagnetic waves from the plasma displays.

After intensive study on the plasma display front panel offering an excellent electromagnetic shielding performance, the inventors have accomplished the present invention based on the findings that a front panel comprising a laminate of a transparent substrate and a synthetic fiber mesh plated with a metal thereon is capable of adequately shielding against the electromagnetic waves from the plasma displays.

SUMMARY OF THE INVENTION

An object of the present invention is to provide a plasma display front panel having an excellent electromagnetic shielding performance.

Another object of the present invention is to provide a plasma display front panel having an excellent electromagnetic shielding performance and an ability of absorbing near-infrared rays.

Another object of the present invention is to provide a plasma display front panel having an excellent electromagnetic shielding performance, and further having an ability of absorbing near-infrared rays and/or abrasion-resistance, anti-reflection property and/or stain-proofing property.

The present invention is as follows;

(1) A plasma display front panel comprising a laminate of a transparent substrate and a synthetic fiber mesh plated with a metal thereon;

(2) A plasma display front panel comprising a laminate of a transparent substrate formed from a resin composition including a copolymer of a monomer having an unsaturated double bond and a phosphorous-containing monomer and a copper-containing compound, and a synthetic fiber mesh plated with a metal thereon.

(3) A plasma display front panel comprising the front panel according to the above (1) or (2), wherein a hard-coat layer and/or an anti-reflection layer and/or a stain-proof layer were further overlaid on the surface of the front panel.

DETAILED DESCRIPTION OF THE INVENTION

Figure 1:
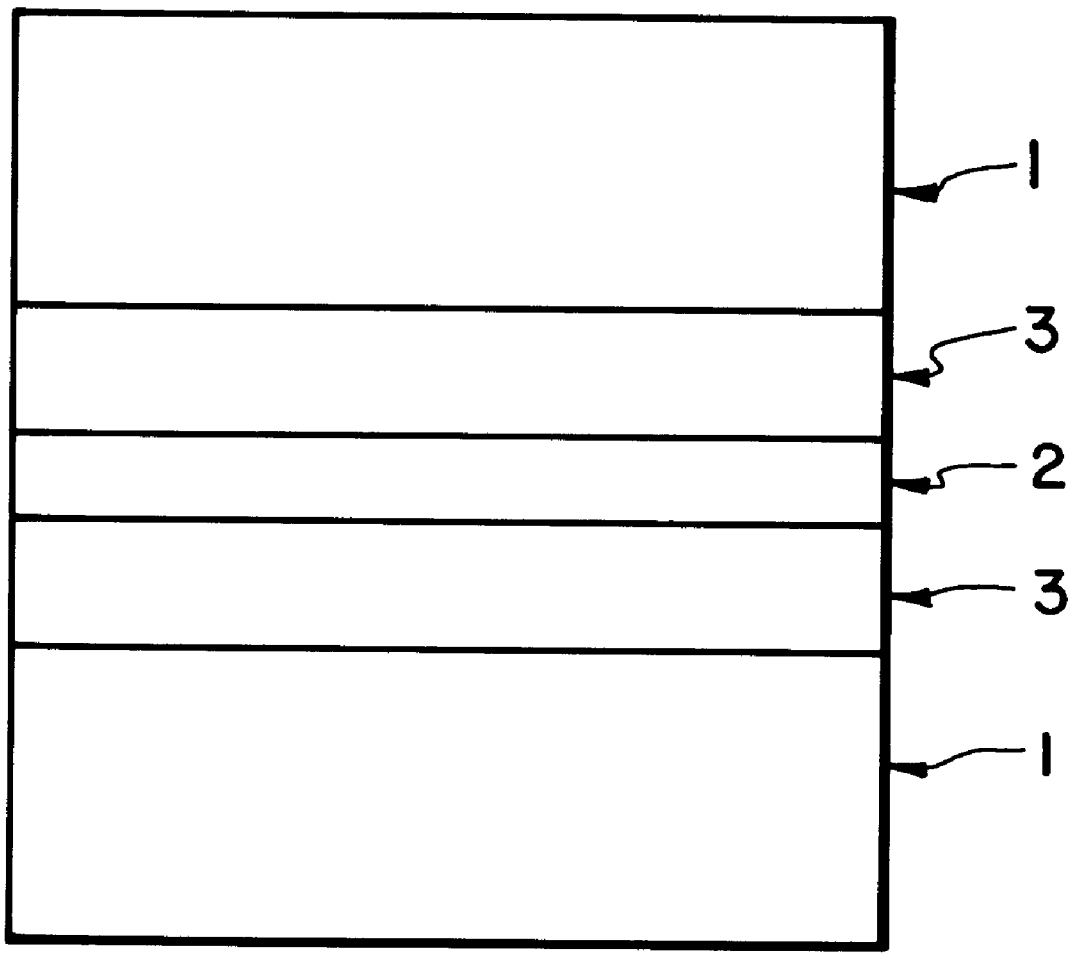
FIG. 1 is a sectional view for illustrating the arrangement according to Example 1 of the present invention wherein a acrylic plate 1 has the transparent substrate, a thin fabric formed of a polyester filament and plated with copper 2 as the synthetic fiber mesh plated with a metal thereon, a soft acrylic film 3 as the soft transparent thermoplastic film.

The plasma display front panel of the present invention is in film or sheet form. Any size of the plasma display front panel can be selected in the accordance with the screen size of the plasma display. Any thickness can be selected, but it is generally in the range of about 0.01 to 10 mm.

The transparent substrate in the present invention has an average light transmittance of not smaller than 50% and more preferably of not smaller than 60% in a wavelength range of 450 to 650 nm. A transparent substrate having an average light transmittance of smaller than 50% results in obscured images on the screen. Further, a preferred transparent substrate has an average light transmittance of not smaller than 50% in a wavelength range of 450 to 650 nm, and an ability of absorbing near-infrared rays such that an average light transmittance in a wavelength range of 800 to 1000 nm is not greater than 30% and more preferably not greater than 20%.

The transparent substrate is formed from a transparent resinous material, glass. Above all, a transparent resinous material provides a good resistance to impact and may preferably be used. Examples of a usable transparent resinous material include acrylic resin, polycarbonate resin, polyester resin, cellulose resin such as triacetylcellulose, diacetylcellulose, styrene resin. Above all, acrylic resin is suitable in terms of the light transmittance, weather resistance.

Likewise, an optical film or sheet imparted with a polarization characteristic may also be employed. Additionally, a light diffusing agent, colorant, lubricant, stabilizer, UV-absorbent, anti-oxidant, antistatic agent, flame-retardant or the like may be added, if required. The transparent substrate may be of a single layer type or a laminate type having multiple resin layers.

The transparent substrate having an average light transmittance of not smaller than 50% in the wavelength range of 450 to 650 nm may be obtained by polymerizing monomers having an unsaturated double bond or mixtures thereof and forming. The monomer having an unsaturated double bond is a monofunctional or multifunctional monomer having at least one unsaturated double bond serving for radical polymerization in its molecule.

Examples of the monofunctional monomer include (meth) acrylates such as methyl (meth)acrylate, ethyl (meth) acrylate, propyl (meth)acrylate, butyl (meth)acrylate, 2-ethylhexyl (meth)acrylate; (meth)acrylates having a alicyclic hydrocarbon group such as bornyl (meth)acrylate, fenchyl (meth)acrylate, 1-menthyl (meth)acrylate, adamantyl (meth)acrylate, dimethyladamantyl (meth)acrylate, cyclohexyl (meth)acrylate, isobornyl (meth)acrylate, tricyclo[$5.2.1.0^{2,6}$]deca-8-yl (meth)acrylate, dicyclopentenyl (meth)acrylate; styrene monomers such as styrene, α-methyl styrene, vinyltoluene chlorostyrene, bromostyrene; unsaturated carboxylic acid such as (meth)acrylic acid, maleic acid, itaconic acid; acid anhydrides such as maleic anhydride, itaconic acid anhydride; hydroxyl-group-containing monomers such as 2-hydroxyethyl (meth) acrylate, 2-hydroxypropyl (meth)acrylate, tetrahydrofurfuryl (meth)acrylate, monoglycerol (meth)acrylate; nitrogen-containing monomers such as acrylamide, methacrylamide, acrylonitrile, methacrylonitrile, diacetone acrylamide, dimethylaminoethyl methacrylate; epoxy-group-containing monomers such as allyl glycidyl ether, glycidyl acrylate, glycidyl methacrylate; alkylene oxide-group-containing monomers such as polyethylene glycol monomethacrylate, polypropylene glycol monomethacrylate, polyethylene glycol monoallyl ether; and other monomers such as vinyl acetate, vinyl chloride, vinylidene chloride, vinylidene fluoride, ethylene.

Examples of the multifunctional monomer include alkyldiol di(meth)acrylates such as ethylene glycol di(meth)acrylate, 1,4-butanediol di(meth)acrylate, neopentylglycol di(meth)acrylate; alkylenediol di(meth)acrylates such as tetraethyleneglycol di(meth)acrylate, tetrapropyleneglycol diacrylate; aromatic multifunctional compounds such as divinylbenzene, diallylphthalate; and (meth)acrylates of multivalent alcohol such as pentaerythritol tetra(meth)acrylate, trimethylolpropane tri(meth)acrylate.

The above-described term "(meta)acrylate" refers to acrylate or methacrylate.

Above all, (meth)acrylates and styrene monomers are preferable in terms of the availability and transparency of the resultant resin. It is to be noted that the above-described monomers may be used in combination of two or more kinds thereof.

Such monomers having an unsaturated double bond or the mixtures thereof may be polymerized by a known method such as bulk polymerization, suspension polymerization, emulsion polymerization. The resinous materials may be formed by a known method such as extrusion, casting. The transparent substrate thus obtained normally has an average light transmittance of not smaller than 90% in a wavelength range of 450 to 650 nm.

On the other hand, the transparent substrate having an average light transmittance of not smaller than 50% in the wavelength range of 450 to 650 nm and an ability of absorbing near-infrared rays such that an average light transmittance in the wavelength range of 800 to 1000 nm is not greater than 30% may be formed from resinous composition having an ability of absorbing near-infrared rays. Alternatively, the transparent substrate having an ability of absorbing near-infrared rays may be formed by means of providing with a layer of resinous composition having an ability of absorbing near-infrared rays on the transparent substrate having no ability of absorbing near-infrared rays.

The following exemplify resinous compositions having an ability of absorbing near-infrared rays:

(1) A resinous composition comprising a copolymer of a monomer having an unsaturated double bond and a phosphorus-containing monomer, and a copper-containing compound, as disclosed in Japanese Unexamined Patent Publication No.6(1994)-118228;

(2) A resinous composition comprising a copper compound and a phosphorus compound, as disclosed in Japanese Examined Patent Publication No.62(1987)-1590;

(3) A resinous composition comprising as copper compound and a thiourea derivative, as disclosed in Japanese Unexamined Patent Publication No.6(1994)-73197; and (4) A resinous composition comprising a tungsten compound, as disclosed in U.S. Pat. No. 3,647,729.

Above all, the resinous composition of (1) comprising a copolymer of a monomer having an unsaturated double bond and a phosphorus-containing monomer, and a copper-containing compound is preferable in terms of the light transmittance in a wavelength range of visible rays, as well as strength and durability of a resultant substrate.

The monomer having an unsaturated double bond denotes the above-described monofunctional or multifunctional monomer having in its molecule at least one unsaturated double bond serving for radical polymerization.

The phosphorus-containing monomer is not particularly limited as long as it has an unsaturated double bond serving for radical polymerization and a phosphorus atom in its molecule. However, a compound represented by the following general formula (1) is preferable in terms of strength and durability of a resultant transparent substrate.

$$[CH_2=C(X)COO(Y)_m]_{3-n}-P(O)-(OH)_n \qquad (1)$$

wherein n represents an integer of 1 to 2, X represents a hydrogen atom or a methyl group, Y represents an oxyalkylene group with 2 to 4 carbon atoms, and when Y is an oxyalkylene group with 2 carbon atoms, m denotes a number average of 8 to 20, when Y is an oxyalkylene group with 3 carbon atoms, m denotes a number average of 5 to 20, and when Y is an oxyalkylene group with 4 carbon atoms, m denotes a number average of 4 to 20.

As the oxyalkylene group of Y, a propylene oxide group with 3 carbon atoms is preferred because a resultant transparent substrate is low in hygroscopic property. Incidentally, $[CH_2=C(X)COO(Y)_m]$ group preferably has a total number of carbon atoms of not smaller than 20 on number average. In the case of $[CH_2=C(X)COO(Y)_m]$ having a total number of carbon atoms of not greater than 18, a resultant transparent substrate has a low strength and a high hygroscopic property. Phosphorus-containing monomer is preferably used in which Y is a propylene oxide group with 3 carbon atoms and m is a number of 6 to 20.

A mixing ratio of the phosphorus-containing monomer is in the range of 0.1 to 50 wt % and more preferably of 0.5 to 30 wt % of the copolymer of the monomer having an unsaturated double bond and the phosphorus-containing monomer. If the content of the phosphorus-containing monomer is smaller than 0.1 wt %, a preferable ability of absorbing near-infrared rays cannot be obtained. On the other hand, if the content thereof exceeds 50 wt %, the resultant copolymer is decreased in strength. Incidentally, the above-described phosphorus-containing monomer may be used in combination of two or more types.

The copolymer of the monomer having an unsaturated double bond and the phosphorus-containing monomer may be produced by means of a known polymerization method such as bulk polymerization, suspension polymerization, emulsion polymerization.

Various types of copper-containing compounds may be used and no particular limitation is imposed thereon as long as it contains a copper atom. Examples of a usable copper-containing compound include salts of carboxylic acid and copper ions such as copper acetate, copper formate, copper propionate, copper valerate, copper hexanoate, copper octylate, copper decanoate, copper laurate, copper stearate, copper 2-ethyl hexanoate, copper naphthenate, copper benzoate, copper citrate; complex salt of acetylacetone or acetoacetanilide and copper ions, copper chloride, copper pyrophosphate and the like.

A mixing ratio of the copper-containing compound is in the range of 0.01 to 30 parts by weight and more preferably of 0.1 to 20 parts by weight per 100 parts by weight of the copolymer of the monomer having an unsaturated double bond and the phosphorus-containing monomer. This means that the phosphorus-containing monomer is contained in an amount of about 0.05 to 10 moles per 1 mole of the copper-containing compound.

The method of obtaining the above-described resinous composition comprises the steps of uniformly dissolving a copper-containing compound in a so-called syrup containing a mixture of a monomer having an unsaturated double bond and a phosphorus-containing monomer or otherwise a polymer or a copolymer thereof, and subjecting the resultant mixture solution to polymerization and curing in a cell or cast, for example, thereby forming a predetermined shape therefrom, or bulk polymerization. Such a polymerization may be conducted by known methods. For example, the resinous composition may be polymerized in the presence of a known radical-polymerization initiator or a so-called redox type initiator comprising a radical-polymerization initiator and a promoter, or by irradiating with ultraviolet rays or radioactive rays. The powdery copolymer of a monomer having an unsaturated double bond and a phosphorus-containing monomer may be blended with a copper-containing compound by means of any known method, such as melt kneading, as long as uniform blending is accomplished.

The transparent substrate having an ability of absorbing near-infrared rays may be formed from the above-described resinous composition by means of, for example, the following processes:

(1) A process of making the above-described resinous composition to take the form of plate by extrusion molding method; and (2) A process of cast polymerizing the above-described resinous composition.

A layer having an ability of absorbing near-infrared rays may be overlaid on the substrate having no ability of absorbing near-infrared rays by means of, for example, the following processes:

(1) A process of forming a resinous composition layer by coating the transparent sheet or film surface with resinous composition having an ability of absorbing near-infrared rays;

(2) A process of joining a film made of resinous composition having an ability of absorbing near-infrared rays together with a transparent resin sheet or film;

(3) A process of laminating a transparent resin sheet or film and resinous composition by co-extrusion molding.

The transparent substrate having an ability of absorbing near-infrared rays thus obtained typically has an average light transmittance of not smaller than 60% in a wavelength range of 450 to 650 nm and an average light transmittance of not greater than 20% in a wavelength range of 800 to 1000 nm.

Examples of a synthetic fiber mesh plated with a metal thereon include a thin fabric formed of a polyester filament and plated with copper or nickel, and the like. Various types of synthetic fibers are usable but polyester is preferred in terms of strength, durability and easy etching as preprocessing for the plating process.

A synthetic fiber mesh plated with a metal thereon which is further dark-colored or matte finished by the use of a dye or pigment is effective to control screen flicker and glare.

A synthetic fiber mesh having a larger mesh size presents a lower electromagnetic shielding performance whereas a synthetic fiber mesh having a smaller mesh size results in an unclear image on the screen. Accordingly, a mesh size of the synthetic fiber mesh is preferably in the range of 50 to 300 mesh and more preferably of 100 to 200 mesh. A thickness of the synthetic fiber mesh is preferably in the range of 20 to 200 $\mu$m and more preferably of 50 to 100 $\mu$m.

A method of laminating the transparent substrate and the synthetic fiber mesh plated with a metal thereon is not particularly limited. However, preferably employed is a method of heating and pressing the transparent substrate and the synthetic fiber mesh plated with a metal thereon for lamination. For example, such lamination may be accomplished by the conventional hot pressing. A pressing temperature is properly selected depending on a used material. In general, the hot pressing is performed under the conditions of temperatures of 110 to 180° C. and pressures of 10 to 50 kg/cm$^2$. Alternatively, the lamination may be accomplished by press bonding by the use of a conventional heat roller. In this case, the surface temperature of the heat roller is in a similar range to that of the above hot pressing. In this manner, there may be produced a plasma display front panel comprising the transparent substrate with the synthetic fiber mesh plated with a metal thereon laminated to one side thereof or a front panel comprising a laminate of two transparent substrates and the synthetic fiber mesh plated with a metal thereon interposed therebetween.

In order to prevent the degradation or deformation, such as mesh-expansion, of the synthetic fiber mesh plated with a metal thereon in the process of laminating the transparent substrate with the synthetic fiber mesh plated with a metal thereon, a soft transparent thermoplastic resin film may preferably be interposed between the transparent substrate and the synthetic fiber mesh plated with a metal thereon. Such degradation and deformation of the synthetic fiber mesh plated with a metal thereon constitute the cause of reduced electromagnetic shielding.

As the soft transparent thermoplastic resin film, used is a highly transparent resin film of a low softening point. Examples of a usable resin film include an acrylic film, a vinyl chloride film and the like. The film may have a Vicat softening point measured based on JIS K7206 in the range of 40 to 100° C., and more preferably of 50 to 80° C. The thickness of the film is preferably in the range of 10 to 200 $\mu$m and more preferably of 20 to 100 $\mu$m.

The plasma display front panel comprising a laminate of the transparent substrate and the synthetic fiber mesh plated with a metal thereon presents an excellent electromagnetic shielding performance than a front panel comprising a laminate of a transparent substrate and a conductive film.

The surface of the plasma display front panel of the present invention may frequently be touched by a user or susceptible to abrasions when dusts adhered to the panel surface are removed. Accordingly, it is desirable to apply a hard-coat layer to the surface of the front panel for enhancing the hardness of the panel surface. The hard-coat layer may be formed from any of known materials for this purpose. For example, a material comprising a multifunctional monomer may be polymerized and cured to form a hard-coat film.

Examples of the hard-coat layer include a layer obtained by polymerizing and curing multifunctional polymeric compounds having two or more (meth)acryloyl groups, such as urethane (meth)acrylate, polyester (meth)acrylate, polyether (meth)acrylate, under irradiation with activation energy rays such as ultraviolet rays, electron rays; and a layer obtained by heating a crosslinkable resinous material of silicone type, melamine type, epoxy type for crosslinking and curing.

Above all, a layer obtained by curing a urethane acrylate resinous material under irradiation with ultraviolet rays or electron rays and a layer obtained by hot curing a silicone resin material are preferred in terms of durability and easy handling.

Incidentally, inorganic compound particles may be added to a coating solution such that the layer surface may be made rough for the control of luster on the hard-coat layer surface. Examples of a usable inorganic compound include inorganic oxides such as silicon dioxide, aluminum oxide, magnesium oxide, tin oxide, silicon monoxide, zirconium oxide, titanium oxide.

In order to form the hard-coat layer, a coating material is first applied by a known coating method such as spinning coating, dip coating, roll coating, gravure coating, curtain-flow coating, bar coating. Subsequently, the material thus coated may be cured by a curing method suitable for the used material. In this process, the coating solution may be diluted with a solvent of various types for providing quick, positive bonding of the coating layer or adjusting the thickness of the coating layer. Although the thickness of the hard-coat layer is not particularly limited, a preferable thickness is in the range of 1 to 20 μm. A hard-coat layer smaller than 1 μm in thickness results in the production of moire fringes on the screen, which are disadvantageous in terms of the appearance of the panel. On the other hand, a hard-coat layer greater than 20 μm in thickness has an insufficient strength and is apt to produce cracks therein.

The plasma display front panel of the present invention is preferably provided with an anti-reflection layer for preventing the reflection of the ambient scene thereon and improving the visibility thereof. The anti-reflection layer may be applied directly to the surface of the transparent substrate or to the surface of the hard-coat layer over the transparent substrate surface. Examples of a usable anti-reflection layer include a multi-layered anti-reflection film comprising a combination of a substance of a low refraction index, such as magnesium fluoride, silicon oxide and the like, and a substance of a high refraction index, such as titanium oxide, tantalum oxide, tin oxide, indium oxide, zirconium oxide, zinc oxide; a single-layered anti-reflection film comprised of a substance of a low refraction index; and the above films further including a bonding layer or a surface modifier layer for enhancing the bonding property or hardness thereof.

In a case where the anti-reflection layer is applied to the screen side of the plasma display, the anti-reflection layer is required of good resistance to heat from the screen. The anti-reflection layer may be formed by a known method such as coating, vacuum deposition, ion plating, sputtering and the like.

The anti-reflection layer is effective to prevent the reflection of the ambient scene on the screen for enhancement of the visibility thereof but is apt to shown stains such as of finger marks, finger prints, cosmetics and the like. For prevention and easy removal of such stains, a stain-proof layer may be overlaid on the anti-reflection layer. The stain-proof layer is not particularly limited and any of the known stain-proof layers may be employed. For example, the stain-proof layer may comprise a compound containing fluorine and siloxane, as disclosed in Japanese Unexamined Patent Publication Nos.3(1991)-266801, 6(1994)-256756 and 1(1989)-294709 and Japanese Examined Patent Publication No.6(1994)-29332.

The hard-coat layer, anti-reflection layer and stain-proof layer may be directly overlaid on the surface of the transparent substrate or of the front panel comprising a laminate of the transparent substrate and the synthetic fiber mesh plated with a metal thereon. Otherwise, a sheet or film comprising the above layers may be laminated or bonded to the surface thereof. The hard-coat layer, anti-reflection layer and stain-proof layer may be overlaid either on both sides or on one side of the plasma display front panel depending upon the use of the plasma display front panel.

The plasma display front panel of the present invention preferably has a total light transmittance of 30 to 75% (as measured based on JIS K7105) for enhancement of the image contrast. The total light transmittance can be adjusted to 75% or less by coloring the transparent substrate with a dye or pigment, varying the type of the synthetic fiber mesh plated with a metal thereon, or forming the substrate of multiple layers.

The plasma display front panel of the present invention provides an excellent electromagnetic shielding performance as mounted to the front side of the plasma display. Furthermore, the plasma display front panel of the present invention can be imparted with properties such as an ability of absorbing near-infrared rays, anti-reflection and stain resistance.

EXAMPLES

The present invention will be further illustrated with reference to the following examples.

The evaluations were conducted according to the following method.

(1) Light Transmittance

Each sample was measured on a spectral transmittance in the wavelength range of 450 to 1000 nm by the use of a self-registering spectrophotometer 330 manufactured by Hitachi Ltd.

(2) Visibility

The obtained plasma display front panel was mounted to the front side of the plasma display so that a vision through the front panel was compared with a vision without the front panel so as to determine differences in image colors and outlines.

(3) Electromagnetic Shielding Performance

The electromagnetic shielding performance of each sample was evaluated by the use of a shielding material evaluation system R2547 manufactured by Advantest Corp. The Electromagnetic shielding performance with respect to different frequencies was evaluated based on the following expression (2):

$$\text{Electromagnetic shielding performance(dB)} = 20 \times \text{Log}_{10}(X_0/X) \quad (2)$$

wherein $X_0$ denotes an intensity of electromagnetic waves measured without a sample set in place, and X denotes an intensity of electromagnetic waves measured with a sample set in place. When no electromagnetic shielding performance is presented, the expression gives a value of 0 dB, which value increases as the shielding performance becomes larger.

(4) Remote-Control Test

The obtained plasma display front panel was mounted to place before a remote-control-light receiving portion of a TV set intended for the home, to which a remote control signal (950 nm in wavelength) was sent from a remote controller three meters away therefrom so as to see if the light receiving portion responded to the control signal.

When near-infrared rays emitted from the plasma display are weaker than those from the remote controller, and therefore, there is no response to the near-infrared rays from the plasma display, it can be determined that near-infrared rays from the plasma display is prevented from interfering with the signal from the remote controller.

Example 1

A 3 mm-thick acrylic plate 1 (Sumipex 7000 commercially available from Sumitomo Chemical Co., Ltd.) was used as the transparent substrate.

A thin fabric formed of a polyester filament and plated with copper 2 (commercially available from Seiren Co., Ltd., a size of 620×420 mm, a thickness of 60 μm and a mesh size of 135) was used as the synthetic fiber mesh plated with a metal thereon.

A soft acrylic film 3 (Sundulene SD003 commercially available from Kanegafuchi Chemical Industry Co., Ltd., a size of 600×400 mm, a thickness of 3 mm) was used as the soft transparent thermoplastic film.

The acrylic plate 1, the thin fabric formed of a polyester filament and plated with copper 2 and the soft acrylic film were stacked on one another, as shown in FIG. 1.

A stack of the above components was sandwiched between cover plates formed of stainless steel, 700×700 mm in size and 3 mm in thickness, with the transparent substrate contacting a planished surface of the cover plate. The stack in this state was loaded to a 50-t oil hydraulic press and subject to heating and pressing at a pressing temperature of 150° C. and a pressure of 40 kg/cm² for 10 minutes for lamination thereof. After cooling, the stainless steel cover plates were removed to give a plasma display front panel free from warps and cracks. A light transmittance of the obtained plasma display front panel is shown in Table 1 whereas an electromagnetic shielding performance thereof is shown in Table 2.

Example 2

An anti-reflection layer was formed by means of vacuum deposition of aluminum oxide, magnesium fluoride and silicon oxide in the order named on a hard-coated polyethylene terephthalate (PET) film (188 μm in thickness and commercially available from Toyobo Co., Ltd.).

On the other hand, a PET film without the hard-coat layer (188 μm in thickness and commercially available from Toyobo Co., Ltd.) was subject to a similar vacuum deposition to form an anti-reflection layer thereon.

A fluorine-containing silane compound represented by the following chemical formula (having a number average molecular weight of about 5000 and a vinyl trichlorosilane unit of an average polymerization degree of about 2, and being commercially available from Daikin Kogyo Co., Ltd.) was diluted with tetradecafluorohexane thereby preparing a solution, as a stain-proof treatment solution, containing the compound in a concentration of 0.1 wt %.

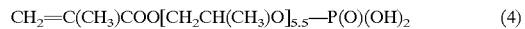
$$C_3F_7\text{·}(OCF_2CF_2CF_2)_{24}\text{·}O(CF_2)_2\text{·}[CH_2CH\text{—}Si\text{·}(OCH_3)_3]_{1-10}\text{—}H \quad (3)$$

After a mask film was applied to the above-described hard-coated PET film on a side thereof opposite to the side on which the above described anti-reflection layer was overlaid, the film was dipped in the stain-proof treatment solution and drawn out therefrom at a speed of 1.5 cm/min. for coating. Subsequently, the film was allowed to stand at room temperature for 24 hours so as to allow for the volatilization of the solvent whereby a stain-proof layer was overlaid on the surface of the anti-reflection layer. The mask film was removed when the film was bonded to a plasma display front panel which will be described as below.

The anti-reflection film (without the hard-coat layer) obtained in the above described manner was bonded to one side of a plasma display front panel obtained in the same manner as in Example 1 and to the opposite side thereto, was bonded the anti-reflection film with the stain-proof layer overlaid in the above-described manner whereby a plasma display front panel was produced. This plasma display front panel was mounted to the front side of a plasma display with its anti-reflection film with the stain-proof layer facing outside. This plasma display front panel had quite a good appearance and bore very little reflected image thereon. This plasma display front panel was subject to the remote control test and allowed response to the remote control signal. A light transmittance of this plasma display front panel is shown in Table 1 whereas an electromagnetic shielding performance thereof is shown in Table 2.

Example 3

10 parts by weight of a phosphorus-containing compound represented by the following chemical formula (4) was added to 100 parts by weight of a mixture comprising 45 wt % of methyl methacrylate, 25 wt % of isobornyl methacrylate and 30 wt % of polyethyleneglycol (average molecular weight of 200) dimethacrylate. Subsequently, 5 parts by weight of copper benzoate anhydride as the copper-containing compound and 0.5 parts by weight of t-butyl peroxy-2-ethyl hexanoate as the radical-polymerization initiator were dissolved therein. The resultant mixture solution was injected in a polymerization cell comprising a 3-mm polyvinyl chloride gasket and 2 pieces of 620×420×10-mm glass plates and subjected to heating at 50° C. for 12 hours and at 100° C. for 2 hours for polymerization, thereby giving a plate-like transparent substrate having a size of 600×400 mm and a thickness of 3 mm.

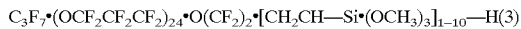
$$CH_2\!=\!C(CH_3)COO[CH_2CH(CH_3)O]_{5.5}\text{—}P(O)(OH)_2 \quad (4)$$

A plasma display front panel was produced in the same manner as in Example 2, except for that the obtained transparent substrate having an ability of absorbing near-infrared rays was used. This plasma display front panel was mounted to the front side of the plasma display with its anti-reflection film with the stain-proof layer facing outside. This plasma display front panel had a transparent pale blue color and quite a good appearance, bearing very little reflected image thereon. This plasma display front panel did not allow response to the control signal in the remote control test. A light transmittance of the plasma display front panel is shown in Table 1 whereas and electromagnetic shielding performance thereof is shown in Table 2.

Comparative Example 1

A front panel was produced in the same manner as in Example 3, except for that the transparent substrate having an ability of absorbing near-infrared rays did not have a thin fabric formed of a polyester filament and plated with copper laminated thereto but had an anti-reflection film bonded thereto. This front panel did not allow response to the signal in the remote control test. A light transmittance of this front panel is shown in Table 1 whereas an electromagnetic shielding performance thereof is shown in Table 2.

Comparative Example 2

A 3-mm thick acrylic plate (Sumipex 000 commercially available from Sumitomo Chemical Industry Co., Ltd.) was used as the transparent substrate. A conductive multi-layered laminate film of Ag and InOx arranged alternately (XIR film commercially available from South Wall Inc.) was bonded to one side of the transparent substrate thereby to produce a front panel. A light transmittance of this front panel is shown in Table 1 whereas an electromagnetic shielding performance thereof is shown in Table 2.

Comparative Example 3

A front panel was produced in the same manner as in Comparative Example 2, except for that the conductive film was bonded to the both sides of the transparent substrate. A light transmittance of this front panel is shown in Table 1 whereas an electromagnetic shielding performance thereof is shown in Table 2.

TABLE 1

| Wavelength | Light transmittance (%) | | | | | |
| | Example | | | Comparative example | | |
| (nm) | 1 | 2 | 3 | 1 | 2 | 3 |
|---|---|---|---|---|---|---|
| 300 | 0 | 0 | 0 | 0 | 0 | 0 |
| 400 | 49 | 46 | 47 | 82 | 47 | 40 |
| 500 | 53 | 54 | 70 | 88 | 79 | 68 |
| 600 | 53 | 55 | 68 | 78 | 78 | 63 |
| 700 | 54 | 55 | 4 | 22 | 59 | 38 |
| 800 | 54 | 54 | 0.2 | 5 | 26 | 10 |
| 900 | 53 | 52 | 0.8 | 6 | 11 | 3 |
| 1000 | 53 | 52 | 2 | 11 | 5 | 1 |

TABLE 2

| Wavelength | Electromagnetic shielding performance (dB) | | | | | |
| | Example | | | Comparative example | | |
| (Mhz) | 1 | 2 | 3 | 1 | 2 | 3 |
|---|---|---|---|---|---|---|
| 30 | 63 | 63 | 55 | 0 | 53 | 62 |
| 50 | 64 | 67 | 53 | 0 | 46 | 56 |
| 70 | 65 | 66 | 50 | 0 | 42 | 52 |
| 90 | 63 | 64 | 45 | 0 | 40 | 50 |

What is claimed is:

1. A front panel for a plasma display comprising a laminate of a transparent substrate and a synthetic fiber mesh plated with a metal thereon, wherein said transparent substrate having an average light transmittance of not smaller than 50% in a wavelength of 450 to 650 nm and an average light transmittance of not greater than 30% in a wavelength of 800 to 1000 nm, and said synthetic fiber mesh having a size of 50 to 300 mesh and a thickness of 20 to 200 82 m.

2. A front panel for a plasma display according to claim 1, wherein said transparent substrate is formed from a resinous composition containing a monomer having an unsaturated double bond.

3. A front panel for a plasma display according to claim 1, wherein said transparent substrate is formed from a resinous composition comprising a copolymer of a monomer having an unsaturated double bond and a phosphorus-containing monomer, and a copper-containing compound.

4. A front panel for a plasma display according to claim 3, wherein said phosphorus-containing monomer is a compound represented by a general formula (1):

$$[CH_2=C(X)COO(Y)_m]_{3-n}-P(O)(OH)_n \qquad (1)$$

wherein n represents an integer of 1 or 2, X represents a hydrogen atom or a methyl group, Y represents an oxyalkylene group with 2 to 4 carbon atoms, and when Y is an oxyalkylene group with 2 carbon atoms, m denotes a number average of 8 to 20, when Y is an oxyalkylene group with 3 carbon atoms, m denotes a number average of 5 to 20, and when Y is an oxyalkylene group with 4 carbon atoms, m denotes a number average of 4 to 20.

5. A front panel for a plasma display according to claim 1, wherein said synthetic fiber mesh plated with a metal thereon is a thin fabric formed of a polyester filament and plated with copper or nickel.

6. A front panel for a plasma display according to claim 1, wherein said transparent substrate and said synthetic fiber mesh plated with a metal thereon are laminated by heating and pressing.

7. A front panel for a plasma display according to claim 1, wherein the transparent substrate and said synthetic fiber mesh plated with a metal thereon are laminated with a soft transparent thermoplastic film interposed therebetween.

8. A front panel for a plasma display according to claim 1, further comprising a hard coat layer on the surface of said transparent substrate.

9. A front panel for a plasma display according to claim 1, further comprising an anti-reflection layer on the surface of said transparent substrate.

10. A front panel for a plasma display according to claim 1, further comprising a stain-proof on the surface of said transparent substrate.

11. A front panel for a plasma display according to claim 8, further comprising an anti-reflection layer on the surface of said hard-coat layer.

12. A front panel for a plasma display according to claim 8, further comprising a stain-proof layer on the surface of said hard-coat layer.

13. A front panel for a plasma display according to claim 9, further comprising a stain-proof layer on the surface of said anti-reflection layer.

14. A front panel for a plasma display according to claim 11, further comprising a stain-proof layer on the surface of said anti-reflection layer.

* * * * *

UNITED STATES PATENT AND TRADEMARK OFFICE
CERTIFICATE OF CORRECTION

PATENT NO. : 6,008,581
DATED : December 28, 1999
INVENTOR(S) : Shinsuke OCHIAI; et al.

It is certified that error appears in the above-identified patent and that said Letters Patent is hereby corrected as shown below:

Please change:

Column 11, claim 1, line 39, "20 to 200 82 m" to --20 to 200 μ m--.

Signed and Sealed this

Twenty-third Day of January, 2001

Attest:

Q. TODD DICKINSON

Attesting Officer      Commissioner of Patents and Trademarks